(12) United States Patent
Chang et al.

(10) Patent No.: US 9,000,464 B2
(45) Date of Patent: Apr. 7, 2015

(54) SEMICONDUCTOR STRUCTURE FOR SUBSTRATE SEPARATION AND METHOD FOR MANUFACTURING THE SAME

(75) Inventors: Chun-Yen Chang, Hsinchu County (TW); Po-Min Tu, Chiayi County (TW); Jet-Rung Chang, Taichung (TW)

(73) Assignee: Design Express Limited, Tortola (VG)

( * ) Notice: Subject to any disclaimer, the term of this patent is extended or adjusted under 35 U.S.C. 154(b) by 156 days.

(21) Appl. No.: 13/409,486

(22) Filed: Mar. 1, 2012

(65) Prior Publication Data
US 2013/0228809 A1    Sep. 5, 2013

(51) Int. Cl.
H01L 33/60 (2010.01)
H01L 29/06 (2006.01)
H01L 33/00 (2010.01)
H01L 33/32 (2010.01)
H01L 33/08 (2010.01)

(52) U.S. Cl.
CPC ............. *H01L 33/0079* (2013.01); *H01L 33/08* (2013.01); *H01L 29/06* (2013.01); *H01L 33/60* (2013.01); *H01L 33/32* (2013.01)

(58) Field of Classification Search
CPC ......... H01L 29/06; H01L 33/08; H01L 33/32; H01L 33/60; H01L 33/0079; H01L 2933/0083
USPC .................................................... 257/79, 98
See application file for complete search history.

(56) References Cited

U.S. PATENT DOCUMENTS

| 6,071,795 | A | 6/2000 | Cheung | |
|---|---|---|---|---|
| 2006/0027818 | A1* | 2/2006 | Yoo .................................. | 257/79 |
| 2006/0284187 | A1* | 12/2006 | Wierer et al. .................... | 257/79 |
| 2011/0012155 | A1* | 1/2011 | Huang et al. ..................... | 257/98 |

FOREIGN PATENT DOCUMENTS

WO  PCT/GB2007/001011    3/2007

OTHER PUBLICATIONS

Jun-Seok Ha et al. "The Fabrication of Vertical Light-Emitting Diodes Using Chemical Lift-off Process", IEEE Photonics Technology Letters, vol. 20, No. 3, Feb. 2008.
Ray-Hua Horng et al. "Transferring Thin Film Gallium Nitride LED Epi-Structure to the Copper Substrate by Chemical Lift-Off Technology", Electrochemical and Solid-State Letters vol. 14, Issue 7, H281-H284, 2011.

(Continued)

*Primary Examiner* — Jerome Jackson, Jr.
*Assistant Examiner* — David Spalla
(74) *Attorney, Agent, or Firm* — WPAT, P.C.; Anthony King; Kay Yang

(57) ABSTRACT

A semiconductor structure includes a temporary substrate; a first semiconductor layer positioned on the temporary substrate; a dielectric layer comprising a plurality of patterned nano-scaled protrusions disposed on the first semiconductor layer; a dielectric layer surrounding the plurality of patterned nano-scaled protrusions and disposed on the first semiconductor layer; and a second semiconductor layer positioned on the dielectric layer, wherein the top surfaces of the patterned nano-scaled protrusions are in contact with the bottom of the second semiconductor layer. An etching process is performed on the semiconductor structure to separate the first semiconductor layer and the second semiconductor layer, in order to detach the temporary substrate from the second semiconductor layer and transfer the second semiconductor layer to a permanent substrate.

8 Claims, 19 Drawing Sheets

(56) References Cited

OTHER PUBLICATIONS

Ke Yan Zang et al. "A New Method for Lift-Off of III-Nitride Semiconductor for Heterogeneous Integration", Nanoscale Research Letters vol. 5, 1051-1056, 2010.

Chia-Feng Lin et al. "Chemical Lift-Off Process for Blue Light-Emitting Diodes.", Applied Physics Express vol. 3, 092101, 2010.
Office Action and search report dated May 6, 2014 from Taiwan counterpart application 101123973.
English translation of the office Action and search report dated May 6, 2014 from Taiwan counterpart application 101123973.

* cited by examiner

SEMICONDUCTOR STRUCTURE FOR SUBSTRATE SEPARATION AND METHOD FOR MANUFACTURING THE SAME

BACKGROUND OF THE INVENTION

1. Technical Field

The present invention relates to a semiconductor structure for substrate separation and a method for manufacturing the same, and more particularly, to a patterned semiconductor structure assisting in substrate separation using a chemical etching process.

2. Background

Recent breakthroughs in efficiency of high power III-nitride based Light Emitting Diodes (LEDs) paved the way for this promising device to move into general lighting applications earlier than expected. High power LED has potential to meet the dollar per lumen target for general lighting by providing comparable illumination per area with fewer LED dies, allowing for the reduction of fabrication and packaging cost. However, the selection of epitaxial substrate remains a key step in such products' design. A lattice matched substrate contributes to perfect crystal quality while a high thermal conductivity substrate improves light emitting efficiency.

Conventional LEDs with two electrodes disposed on the same side of the epitaxial layer unavoidably suffer from current crowding effect, while vertical LEDs with two electrodes placed on opposite sides of the epitaxial layer resolve the current crowding problem due to a shorter current path. In addition, with the integration of a high thermal conductivity substrate (usually metal), vertical LEDs not only dissipate heat efficiently so as to maintain a lower junction temperature, but also retain larger light emitting areas due to the device geometry.

In summary, high power LEDs with perfect crystal quality, high thermal conductivity substrates, and vertical device geometry are considered promising in the current market. Efforts have been made to achieve the abovementioned criteria by separating a conventional sapphire substrate from the epitaxial layers and replacing the sapphire substrate with a metal substrate. These steps can be categorized into a laser lift off (LLO) process and a chemical lift off (CLO) process.

U.S. Pat. No. 6,071,795 titled "Separation of Thin Film from Transparent Substrate by Selective Optical Processing" disclosed the LLO process. As shown in FIG. 1, a gallium nitride epitaxial layer 15 and its original sapphire substrate 19 are flip chip bonded to a carrier substrate 11 via an epoxy 13. A KrF excimer pulse laser 12 is irradiated from the surface of the transparent sapphire substrate, and is then absorbed at the shallow interface of the gallium nitride epitaxial layer 15; this shallow interface corresponds to a separation region 17. The sudden high temperature results in localized heating of the interface, while the short thermal diffusion length, on the order of a micrometer, prevents substantial heating of the active region of the heterostructure, thereby circumventing thermal damage and permitting lift-off of the gallium nitride layer 15. In the separation region 17, a few nanoseconds at temperatures of over 1000 degrees Celsius is sufficient to induce decomposition of the interfacial GaN to liquid Ga metal and nitrogen gas, without causing immediate separation of the growth substrate. Although the decomposition reaction occurs at limited depth and can prevent damages from extending to the crucial light emitting active region, the sudden temperature rise in the interface (i.e. the sapphire and gallium nitride interface) with large difference in thermal expansion coefficients generates high density threading dislocation, which leads to serious wafer cracking and undesired residual strain in the thin film that may compromise the crystal quality of the active region. In addition, the thermal strain can cause the sidewall passivation layer to peel off, degrading the structural integrity of the LEDs.

The CLO process is comparably milder in terms of heat-induced strain at the interface. Furthermore, the selectivity nature of wet etching provides fast and economical options for achieving the substrate separation in LED devices. Jun-Seok Ha et al. published an article titled "The Fabrication of Vertical Light-Emitting Diodes Using Chemical Lift-off Process" in IEEE Photonics Technology Letters, Volume 20, No. 3, February 2008, proposing the use of a sacrificial CrN layer 22 shown in FIG. 2 to separate the gallium nitride thin film and the sapphire substrate 21. A gallium nitride epitaxial layer, including an n-GaN 23, an active layer 24, and a p-GaN 25, is grown on a CrN layer 22 disposed on an original sapphire substrate 21. A p-GaN contact 26 is formed on top of the p-GaN 25 followed by a deposition of a metal substrate 27. The issues with this technique are twofold: 1) gallium nitride crystal quality is seriously compromised since the CrN layer is not a single crystal template for the following gallium nitride epitaxy, and 2) it is almost impossible to utilize a single continuous sacrificial layer design to lift off the epitaxial layer on a large size wafer.

Another article titled "Transferring Thin Film Gallium Nitride LED Epi-Structure to the Copper Substrate by Chemical Lift-Off Technology" and published in Electrochemical and Solid-State Letters Vol. 14, Issue 7, H281-H284 in 2011 by Ray-Hua Horng et al. discloses a method combining an oxide-patterned sacrificial (OPS) layer and an epitaxial lateral overgrowth (ELOG) technique to form a self-detached thin film from the sapphire substrate. As shown in FIG. 3, an OPS layer 33 is patterned on a sapphire substrate 31. An epitaxial gallium nitride layer 35 is then deposited using an ELOG technique, followed by the deposition of a reflective mirror layer 37 and the electroplating of a copper layer 39. Hydrofluoride (HF) is used to remove the OPS layer 33 and render a high stress field concentrated at the post-etch interface, that is, the interface between the sapphire substrate 31 and the gallium nitride epitaxial layer 35. In this manner, the thin film is easily detached from the underlying sapphire substrate 31 and successfully transferred to the copper layer 39. Strain release facilitates the thin film separation process but the ELOG process requires sophisticated crystal growth proficiency with complex growth parameters. Although a low defect density region in the coalescence front is one advantage of the ELOG process, the desired crystal quality region is not continuous and represents only one fifth of the entire wafer surface region.

Ke Yan Zang et al. published an article titled "A New Method For Lift-Off of III-Nitride Semiconductor For Heterogeneous Integration" in Nanoscale Research Letters Vol. 5, 1051-1056 in 2010. A structure designed for a CLO process is shown in FIG. 4. A buffer gallium nitride layer 43 is first deposited on a sapphire substrate 41, and a layer of silicon dioxide is deposited on the buffer gallium nitride layer 43. An anodized alumina (AAO) is used (not shown) to generate an oxide template with nano-scaled pattern and transfer the pattern onto the underlying silicon dioxide layer to form a patterned oxide layer 45. A nano-epitaxial lateral overgrowth (NELO) is then performed to grow gallium nitride thin film 47, followed by a routine HF wet etch. After the silicon dioxide layer is removed, the gallium nitride thin film 47 can be self-released due to the large strain field present at the corners of the gallium nitride thin film positioned in the depression of the silicon dioxide pattern 45. The NELO technique used in this disclosure is more sophisticated than the conventional ELOG, because in adopting metalorganic chemical vapor deposition (MOCVD) as a means for crystal growth, the maintenance of a lamellar supply of the precursor or reactant is crucial. A planar surface is the most desirable geometry for MOCVD because it provides a flat and open reaction platform. Other morphologies will unduly increase the difficulty of the epitaxial growth. Inevitably, any epitaxy performed on a nano-scaled patterned surface suffers from major issues preventing this method from achieving a reasonable yield.

Chia-Feng Lin et al. discloses another CLO method combining a sacrificial layer, selective epitaxial growth, and a crystallographic wet etching approach as published in Applied Physics Express Vol. 3, 092101, in 2010, and the article titled "Chemical Lift-Off Process for Blue Light-Emitting Diodes." The structure proposed in the prior art, as shown in FIG. 5, comprises a truncated-triangle-striped sapphire substrate 51 deposited with an AlN buffer/sacrificial layer 58, an n-GaN layer 53, a multi-quantum well active layer 54, a p-GaN 55, and a transparent contact layer 56. Two distinct crystallographic plans $\{10\bar{1}2\}$ and $\{10\bar{1}5\}$ constitute the two faces of the truncated triangles due to the selective etching using hot sulfuric acid and phosphoric acid. The etchant enters the truncated triangle region through a channel 57 opened by a laser scribing process. The presence of the air voids 52 is partly due to the truncated-triangle pattern on the sapphire substrate 51 and partly the result of epitaxial selective growth in the n-GaN layer 53. Hot potassium hydroxide solution is then applied through the channel 57 and performs a crystallographic etch in the n-GaN layer 53 followed by a lateral etch of the buffer/sacrificial AlN layer 58. Inclined GaN facets $\{10\bar{1}\bar{1}\}$ act as an etch stop preventing damage to the active layer. The thin film separation occurs at the completion of the lateral AlN etch. This technique further generates a roughened post-etch surface on the n-GaN layer 53, which corresponds to a common design feature in optical devices to enhance light extracting efficiency. Easy etching process makes the disclosed method appealing; however, in addition to the complex structure, the unavoidable compromise of the crystal quality still exists due to the lattice mismatch between AlN and GaN.

International application No. PCT/GB2007/001011 titled "Growth Method Using Nanostructure Compliant Layers and HVPE for Producing High Quality Compound Semiconductor Materials" disclosed a sophisticated Hydride Vapor Phase Epitaxy (HVPE) technique in growing a high quality semiconductor layer 69 on an underlying template with nano columns 65 as shown in FIG. 6. This article demonstrates a highly sophisticated epitaxial growth technique so as to perform a high quality ELOG on a nanostructure template followed by a separation process between the high quality semiconductor layer 69 from the nano-scaled compliant layer. The distinction between this international application and the aforementioned ELOG and NELO prior arts lies in the material used as the ELOG template. Nano columns consisting of a compound semiconductor material are used in the international application while silicon dioxide stripe patterns are used in the other two prior arts. A lateral growth on the side walls of the compound semiconductor nano columns 65 can be anticipated, creating an ever-changing template underneath the top high quality semiconductor layer 69.

In light of the stated prior arts, the semiconductor structure proposed in one embodiment of the present invention used for substrate separation in LEDs comprises 1) an array structure which promotes an effective CLO process to increase the penetration of the chemical etchant; and 2) a pseudo-planar template that effectively reduces the difficulty of the epitaxial growth and increases the product yield.

SUMMARY

One aspect of the present invention is to propose a semiconductor structure used for substrate separation in vertical LED manufacturing. The semiconductor structure comprises: a temporary substrate; a first semiconductor layer positioned on the temporary substrate; a dielectric layer including a plurality of patterned nano-scaled protrusions disposed on the first semiconductor layer; wherein the dielectric material in the dielectric layer surrounding the plurality of patterned nano-scaled protrusions and disposed on the first semiconductor layer; and a second semiconductor layer is positioned on the dielectric layer, wherein the top surfaces of the patterned nano-scaled protrusions are in contact with the bottom of the second semiconductor layer. The second semiconductor layer comprises an n-type conductive film positioned on the dielectric layer, a light emitting active film positioned on the n-type conductive film, and a p-type conductive film positioned on the light emitting active film. The abovementioned semiconductor structure further comprises a permanent substrate positioned on the second semiconductor layer and a reflective layer positioned between the permanent substrate and the second semiconductor layer.

Another aspect of the present invention is to disclose a method directed to manufacturing the proposed semiconductor structure used for substrate separation. The method comprises the following steps: depositing a first semiconductor layer having nano-scaled protrusions on a temporary substrate; forming a dielectric layer on the first semiconductor layer, wherein the dielectric material of the dielectric layer fills empty spaces between individual nano-scaled protrusion, and the thickness of the dielectric layer is greater than the height of the nano-scaled protrusions; performing a polishing process on the dielectric layer to expose top surfaces of the nano-scaled protrusions; forming a second semiconductor layer on the dielectric layer; forming a conductive layer on the second semiconductor layer; performing a first etching process to remove the dielectric layer; and performing a second etching process to separate the first semiconductor layer and the second semiconductor layer.

The foregoing has outlined rather broadly the technical advantages of the present invention in order that the detailed description of the invention that follows may be better understood. Additional advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

One aspect of the present invention is to propose a new semiconductor structure for substrate separation in vertical LED manufacturing, and another aspect of the present invention is to disclose an explanatory step-by-step description of how to embody the proposed semiconductor structure. For clarity purposes, this description discloses the manufacturing process of one embodiment of the present invention used for substrate separation in accordance with figures showing each intermediate product.

Figure 1:
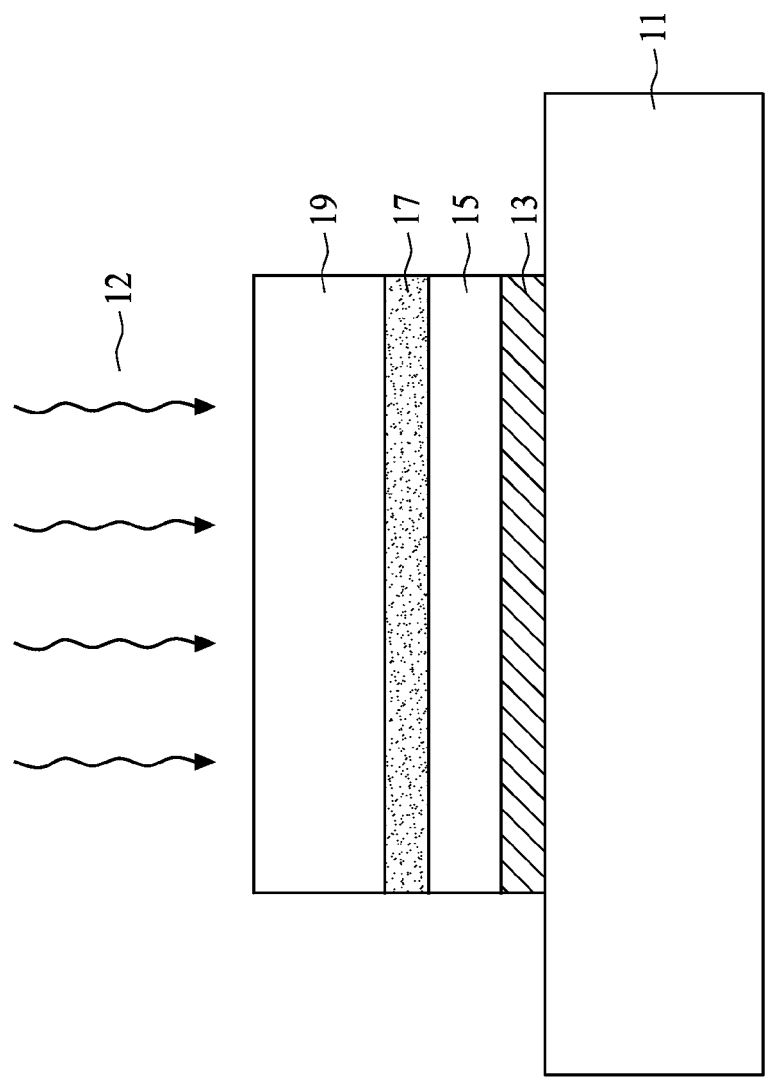
FIG. 1 is a cross-sectional view of a structure used in separation of a thin film by a laser-lift-off (LLO) process disclosed in U.S. Pat. No. 6,071,795.
Figure 2:
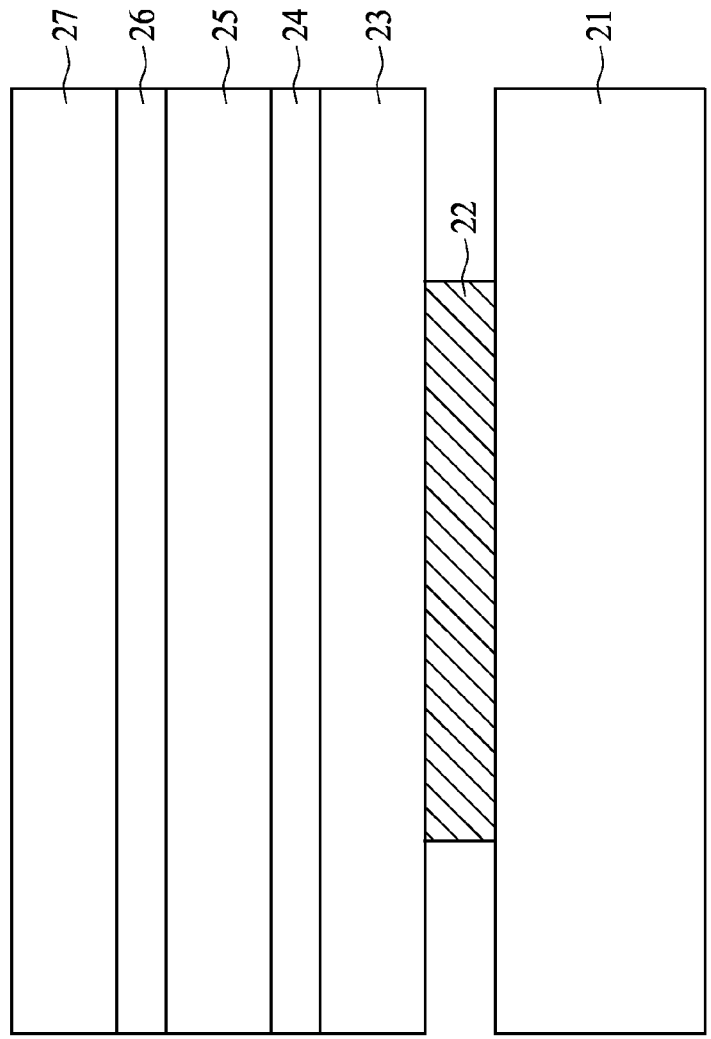
FIG. 2 is a cross-sectional view of a structure having a sacrificial layer used in separation of a substrate and a Light Emitting Diode (LED) disclosed in a prior art.
Figure 3:
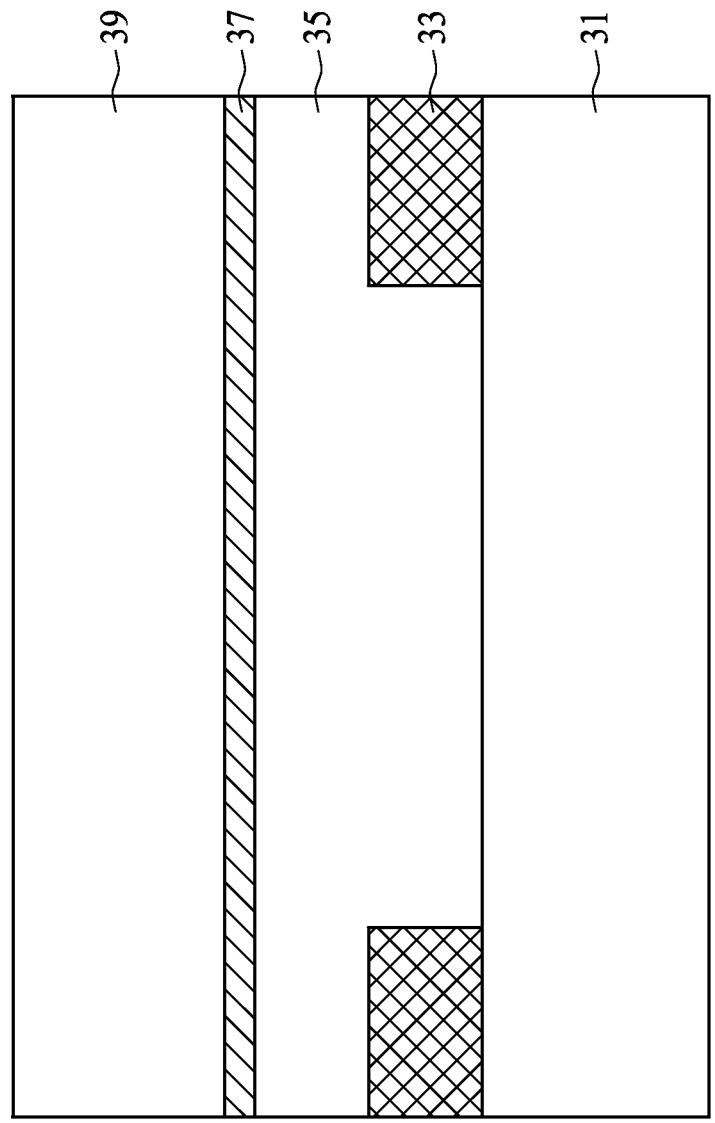
FIG. 3 is a cross-sectional view of a structure with patterned $SiO_2$ stripes used in transferring an epitaxial thin film LED to another substrate disclosed in another prior art.
Figure 4:
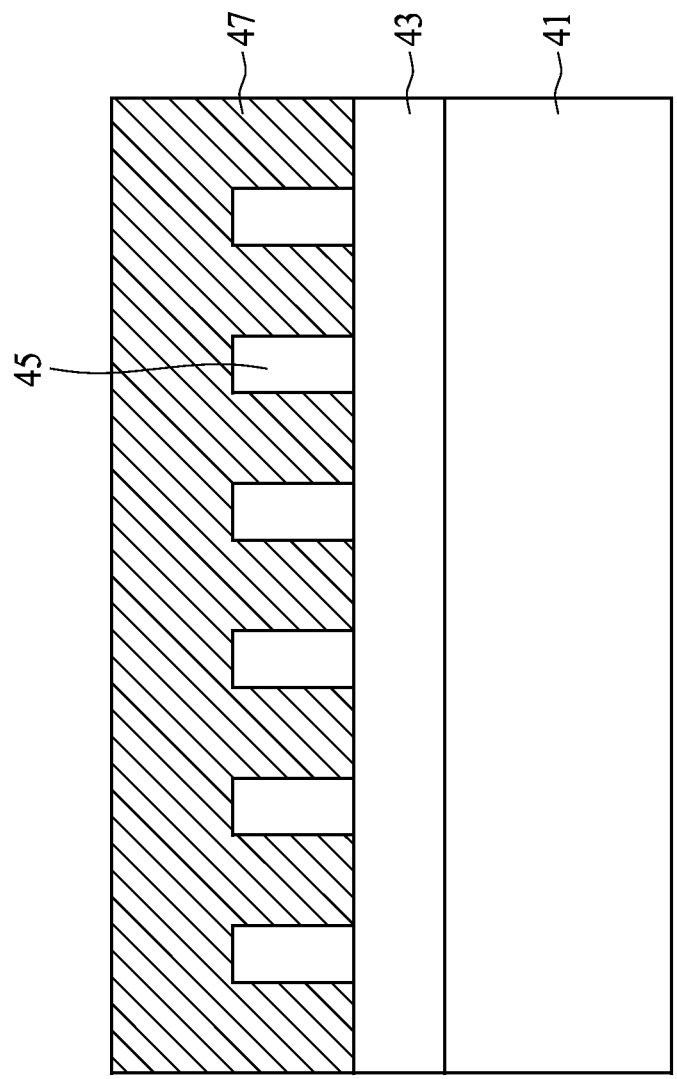
FIG. 4 is a cross-sectional view of a structure for a self-release III-nitride semiconductor layer during a chemical lift off process disclosed in another prior art.
Figure 5:
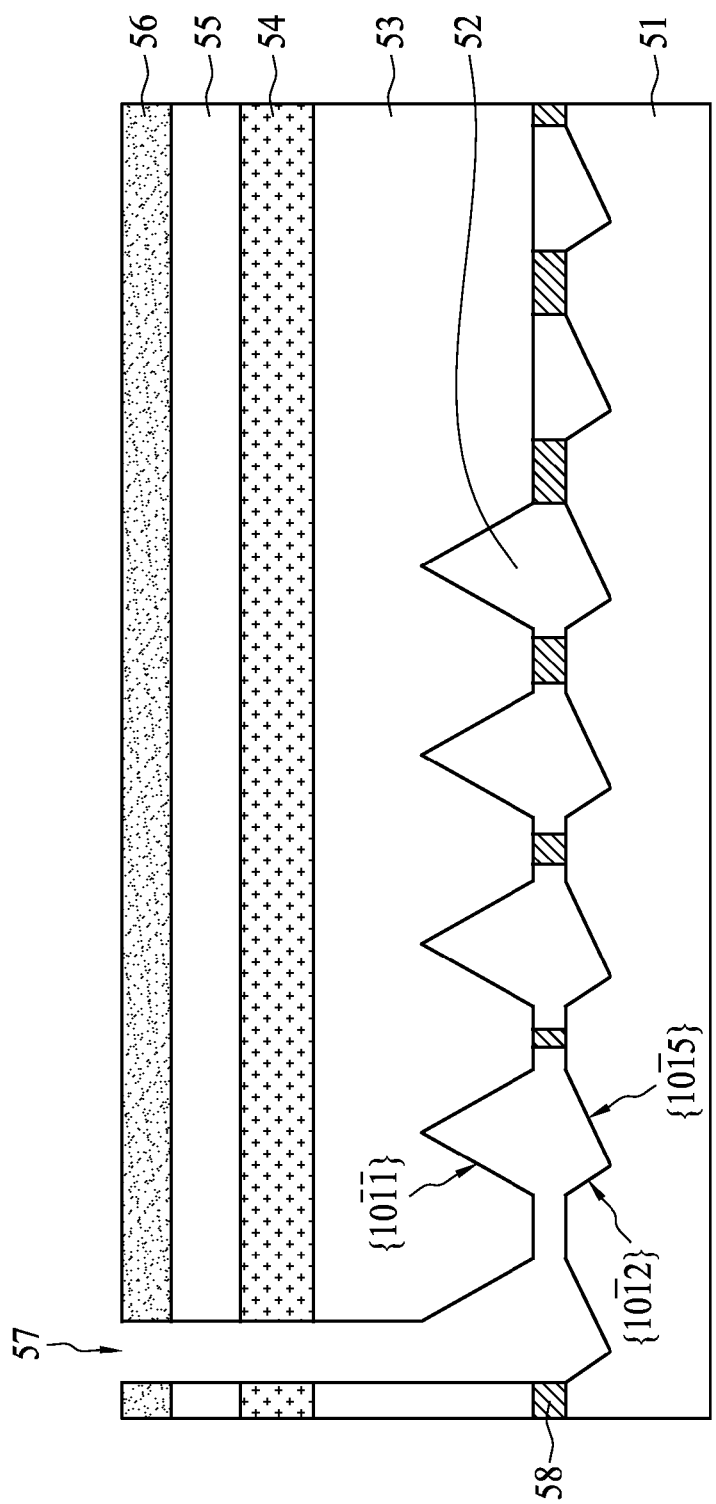
FIG. 5 is a cross-sectional view of a structure with truncated-triangle-striped-pattern used in a semiconductor layer chemical lift off process disclosed in another prior art.
Figure 6:
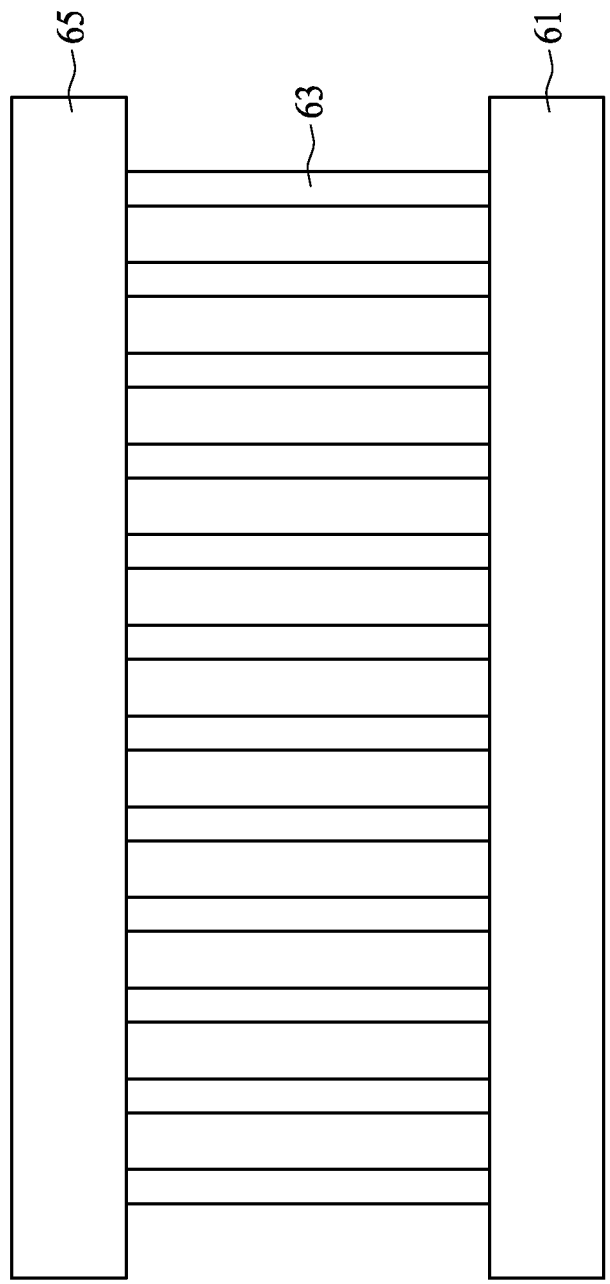
FIG. 6 is a cross-sectional view of nanostructure compliant layers for producing high quality compound semiconductor materials disclosed in International Patent Application No. PCT/GB2007/001011.
Figure 7:
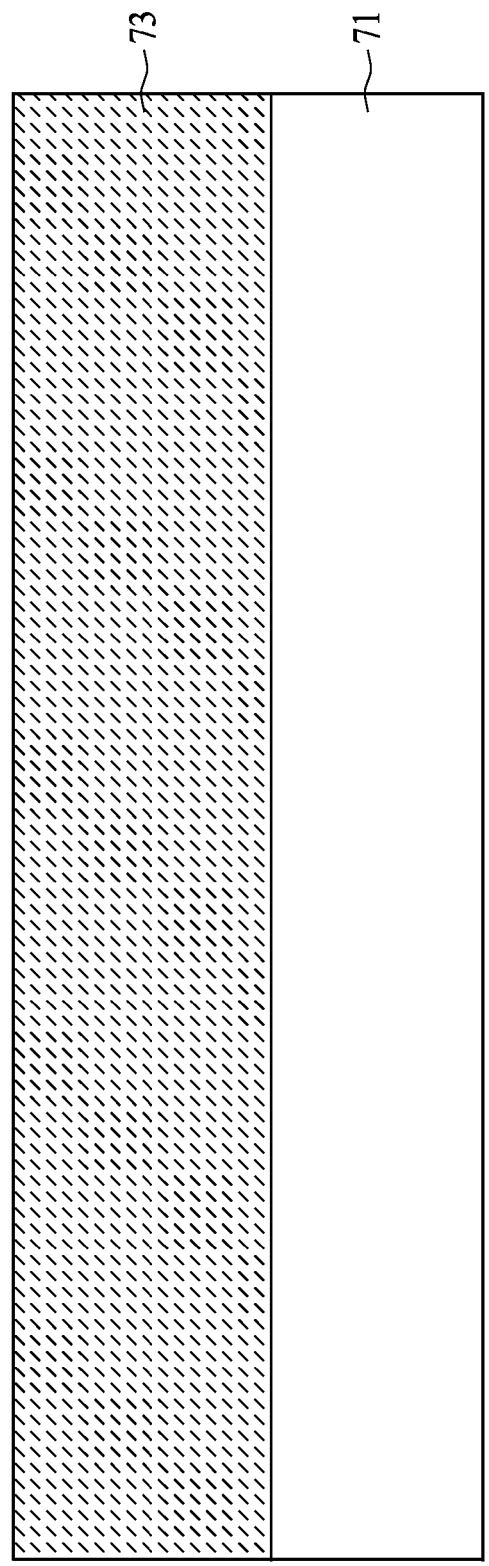
FIGS. 7-15 show cross-sectional views of the intermediate structures disclosed in the present invention during each processing step.
Figure 8:
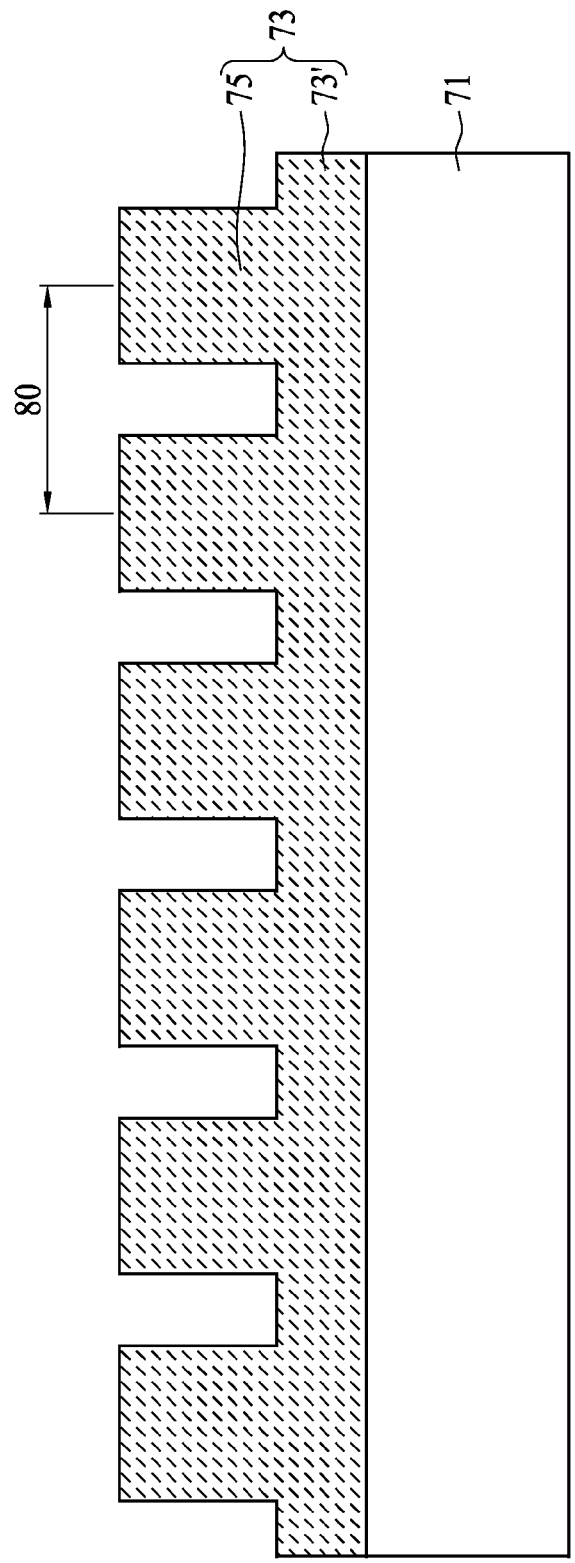
Figure 9:
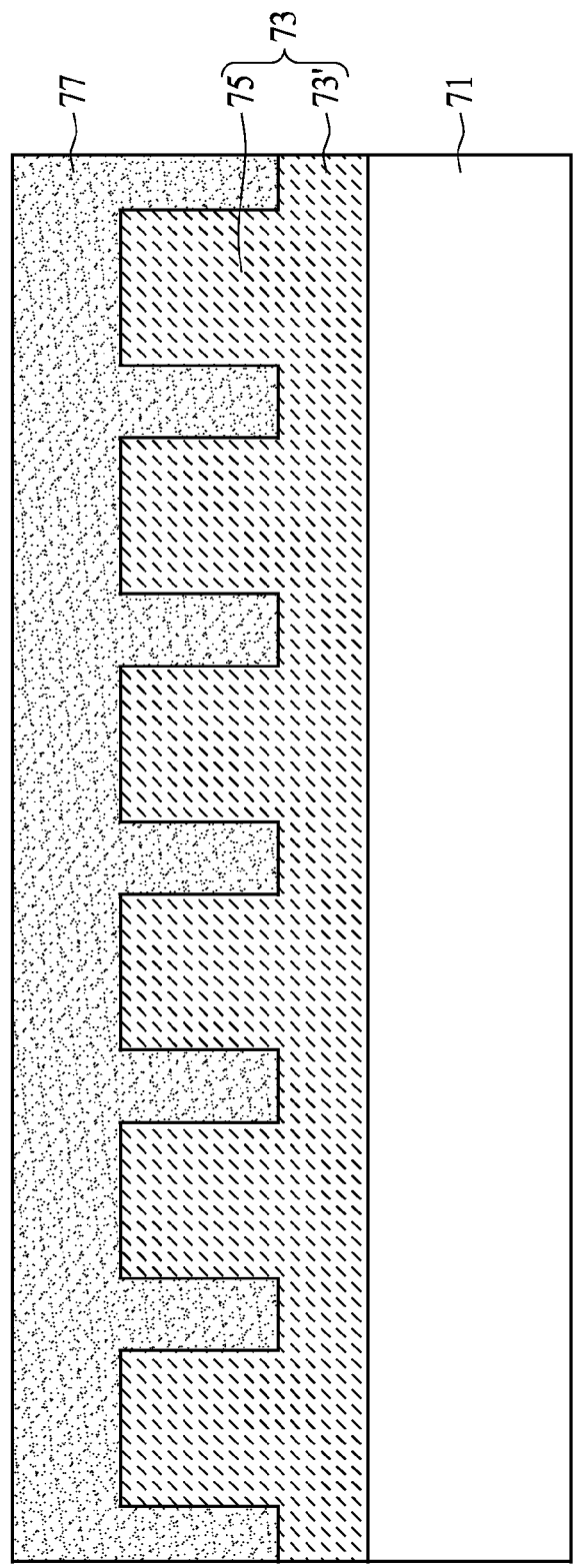
Figure 10:
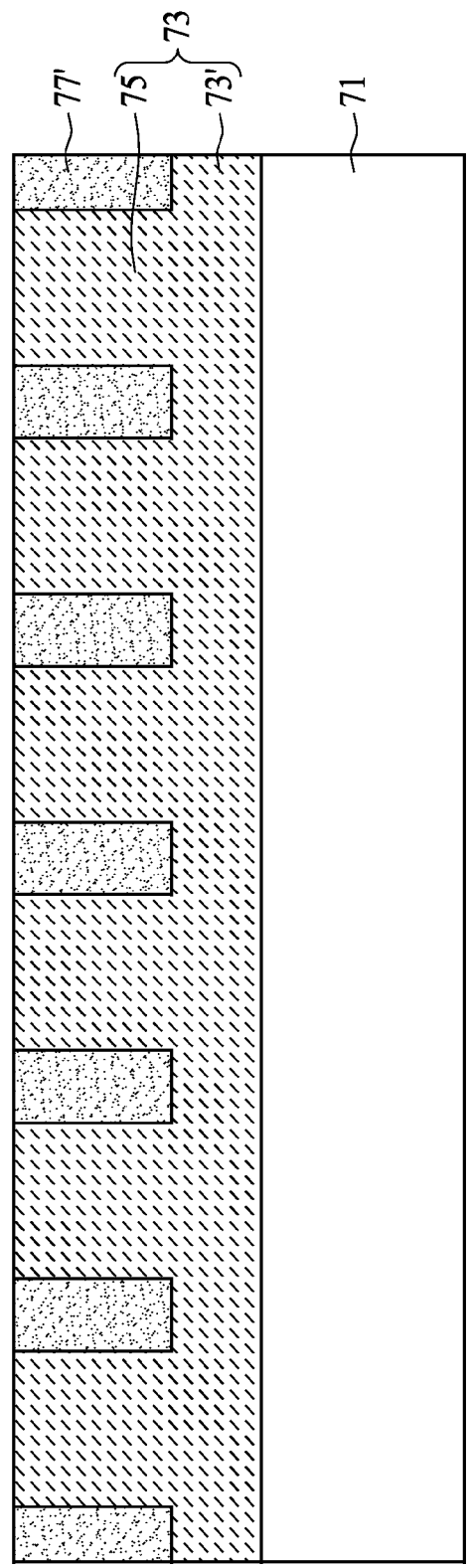

As shown in FIG. 7, a sapphire substrate 71 is provided with a 2 μm GaN thin film 73 epitaxially grown on one surface of the sapphire substrate 71. In other embodiments of the present invention, silicon, silicon carbide, diamond, lithium aluminate (LAO), lithium gallate (LGO), zinc oxide, gallium arsenide, gallium phosphide, and the composite materials thereof can be utilized to be the substrate of the structure. The GaN thin film 73 can be grown to different crystal orientations such as {0001}, {10$\bar{1}$0}, {11$\bar{2}$0}, {11$\bar{2}$4}, {10$\bar{1}$1}, and {20$\bar{2}$1} in accordance to different substrates used. In one embodiment of the present invention, metalorganic chemical vapor deposition (MOCVD) technique is used to carry out the epitaxial growth. A nano-scaled pattern appears on the GaN thin film 73 in FIG. 8. The nano-scaled pattern is produced by a nanoimprint lithography (NIL) process and an inductively coupled plasma reactive ion etch (ICP-RIE) performed on the GaN thin film 73, including the following steps: a layer of silicon dioxide is deposited on the grown GaN thin film 73 using a plasma enhanced CVD (PECVD); next, a nano-scaled circular array pattern is transferred onto the silicon dioxide layer by an NIL and an ICP-RIE using carbon tetrafluoride ($CF_4$) as a reactant gas; the nano-scaled circular array pattern is then transferred onto the underlying GaN thin film 73 using another ICP-RIE system and a plurality of nanopillars 75 are formed. A separation space 80 between each of the plurality of nanopillars 75 can be identified. In some embodiments of the present invention, the separation space 80 is within the range of from 10 nm to 1000 nm, and the nano-scaled patterns can be of polyprisms, stripes, crossed stripes, and the combination thereof. The etching time period can be modulated such that the plurality of nanopillars 75 are formed either on the upper portion of the patterned GaN thin film 73 or on the underlying sapphire substrate 71. In one embodiment of the present invention, the lower portion of the GaN thin film 73 remains a planar GaN thin film 73' sandwiched between the plurality of nanopillars 75 and the sapphire substrate 71. Therefore, the plurality of nanopillars 75 and the planar GaN thin film 73' form a continuous material. In another embodiment of the present invention, GaN thin film 73' is absent since the etching process is hold for a long enough period, and the plurality of nanopillars 75 are directly disposed on the sapphire substrate 71. In one embodiment of the present invention, the height of the nanopillars 75 is under 1000 nm. As shown in FIG. 9, a layer of dielectric materials, such as spin-on-glass (SOG) 77, is spin coated on the plurality of nanopillars 75 to obtain a desired degree of filling. The dielectric materials comprise SOG, silicon oxide, silicon nitride, and silicon oxynitride. The SOG 77 described in the present embodiment can be silsequioxane-based polymer such as hydrogen silesquioxane (HSQ) and methylsequioxane (MSQ). The thickness of the SOG is controlled to be greater than the heights of the nanopillars 75 in order to accommodate any structural variation in the following baking process. In the next step, another ICP-RIE is performed on the SOG layer 77 in order to thin the SOG to a height where the top surface of the nanopillars 75 is exposed. The trimmed SOG 77' exhibits a new thickness that is essentially equal to or less than the heights of the nanopillars 75 as shown in FIG. 10, wherein the nanopillars 75 are completely coated by the trimmed SOG 77' on the sidewall, and the spaces between nanopillars 75 are essentially filled with trimmed SOG 77'. A wet etching process or a chemical mechanical polishing process is carried out to form the trimmed SOG 77'.

Figure 11:
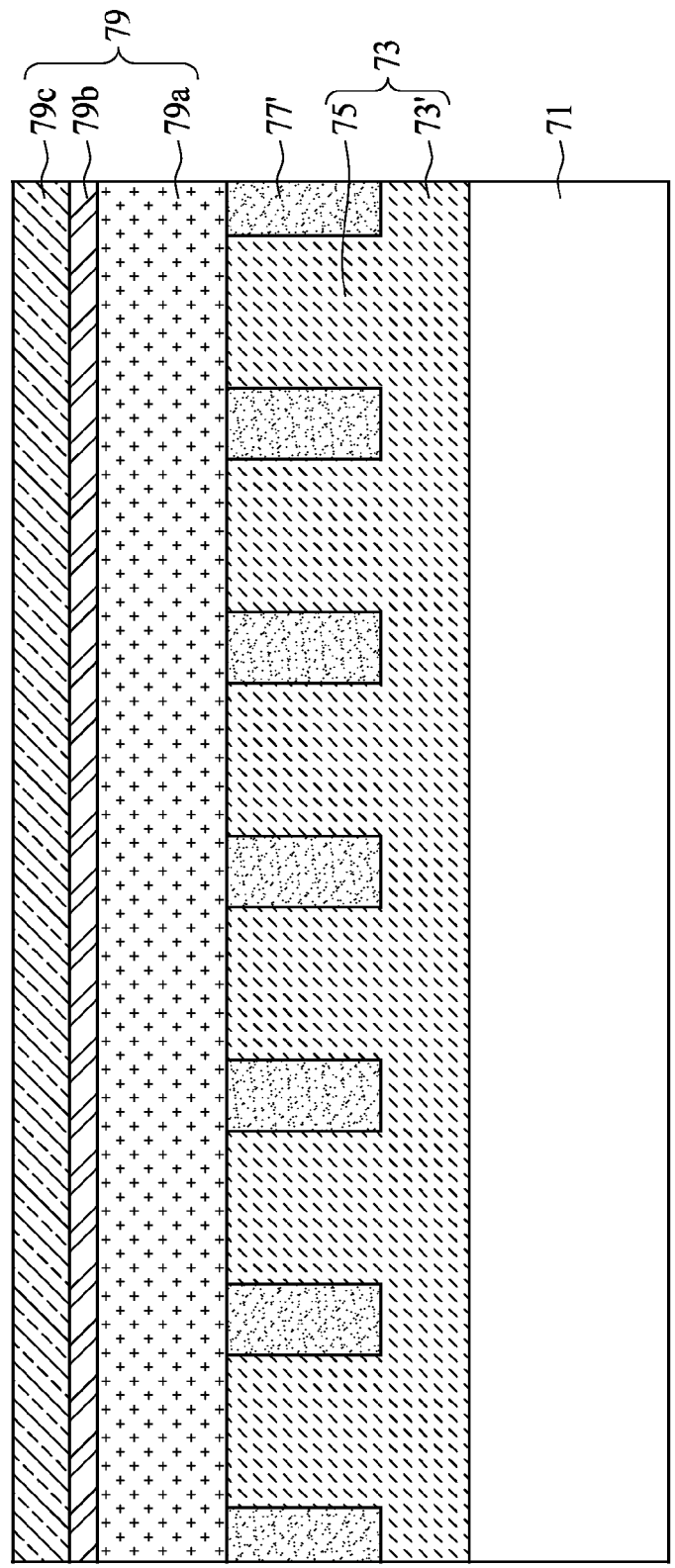

The next step comprises performing an epitaxial regrowth on top of the nanopillars 75 and the trimmed SOG 77'. Since the underlying template ready for regrowth is a virtually flat and open platform, the MOCVD should be carried out under an ideal environment and a high level of crystalline perfection is expected. The epitaxial growth will initiate at the exposed top surface of the nanopillars 75, and an optimal V/III ratio is adopted so as to assist the lateral growth in the GaN epitaxial lateral overgrowth (ELOG) phase. As shown in FIG. 11, a regrowth GaN layer 79 comprises an n-type conductive film 79a, a light emitting active film 79b, and a p-type conductive film 79c, in accordance with the conventional p-i-n structure that is common in light emitting devices. In one embodiment of the present invention, the n-type conductive film is a Si-doped layer, the p-type conductive film is an Mg-doped layer, and the light emitting active film is a multiple quantum well structure.

Figure 12:
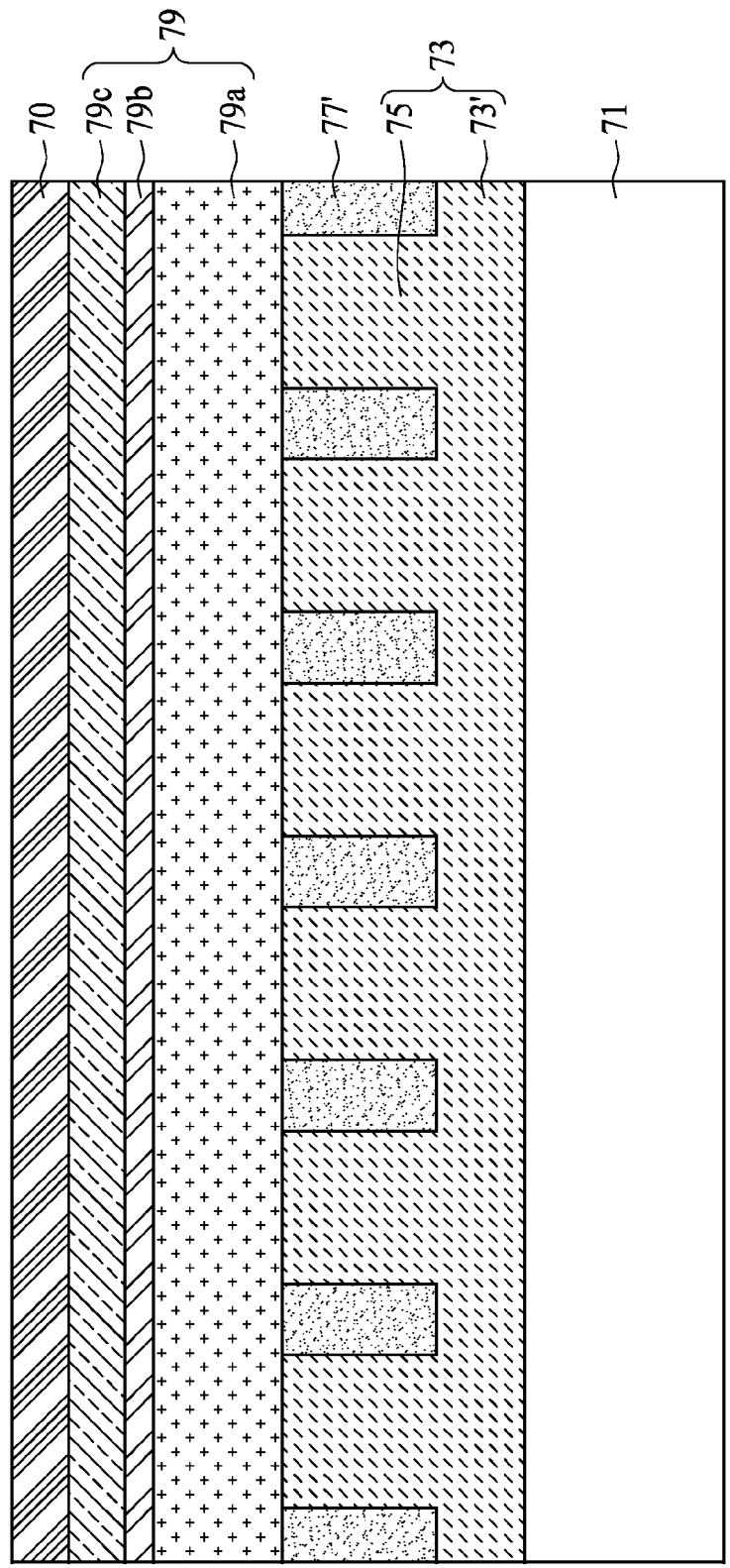
Figure 13:
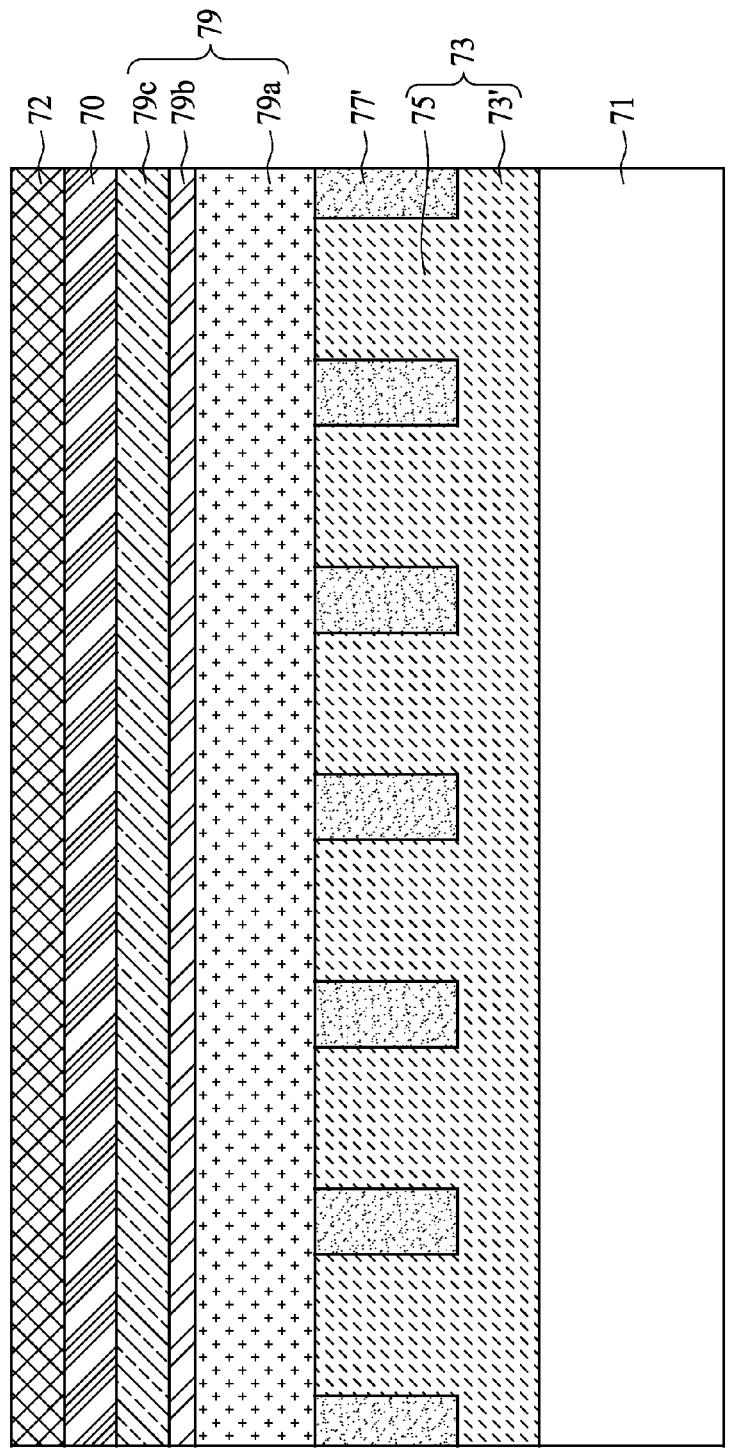

After the completion of the GaN regrowth layer 79, a reflective layer 70 is electroplated or sputtered onto the p-type conductive GaN as shown in FIG. 12. In the embodiments of the present invention, the reflection layer includes aluminum, silver, or the alloy combination thereof. Referring to FIG. 13, a permanent substrate 72 is then electroplated or wafer-bonded to the reflective layer 70. In the embodiments of the present invention, copper is selected to be the permanent substrate based on the criteria of high thermal and electrical conductivity as opposed to the temporary sapphire substrate.

Figure 14:
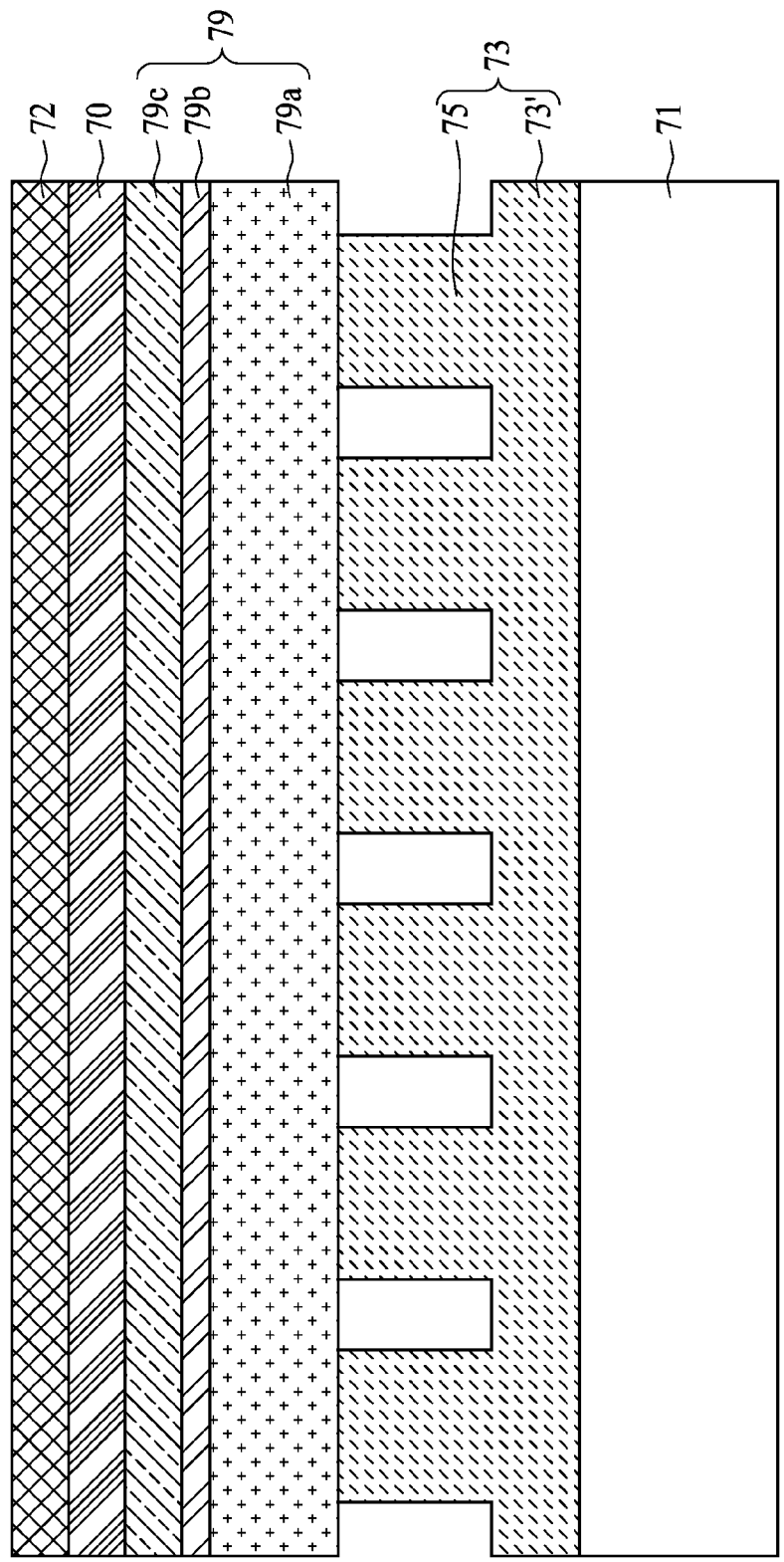
Figure 15:
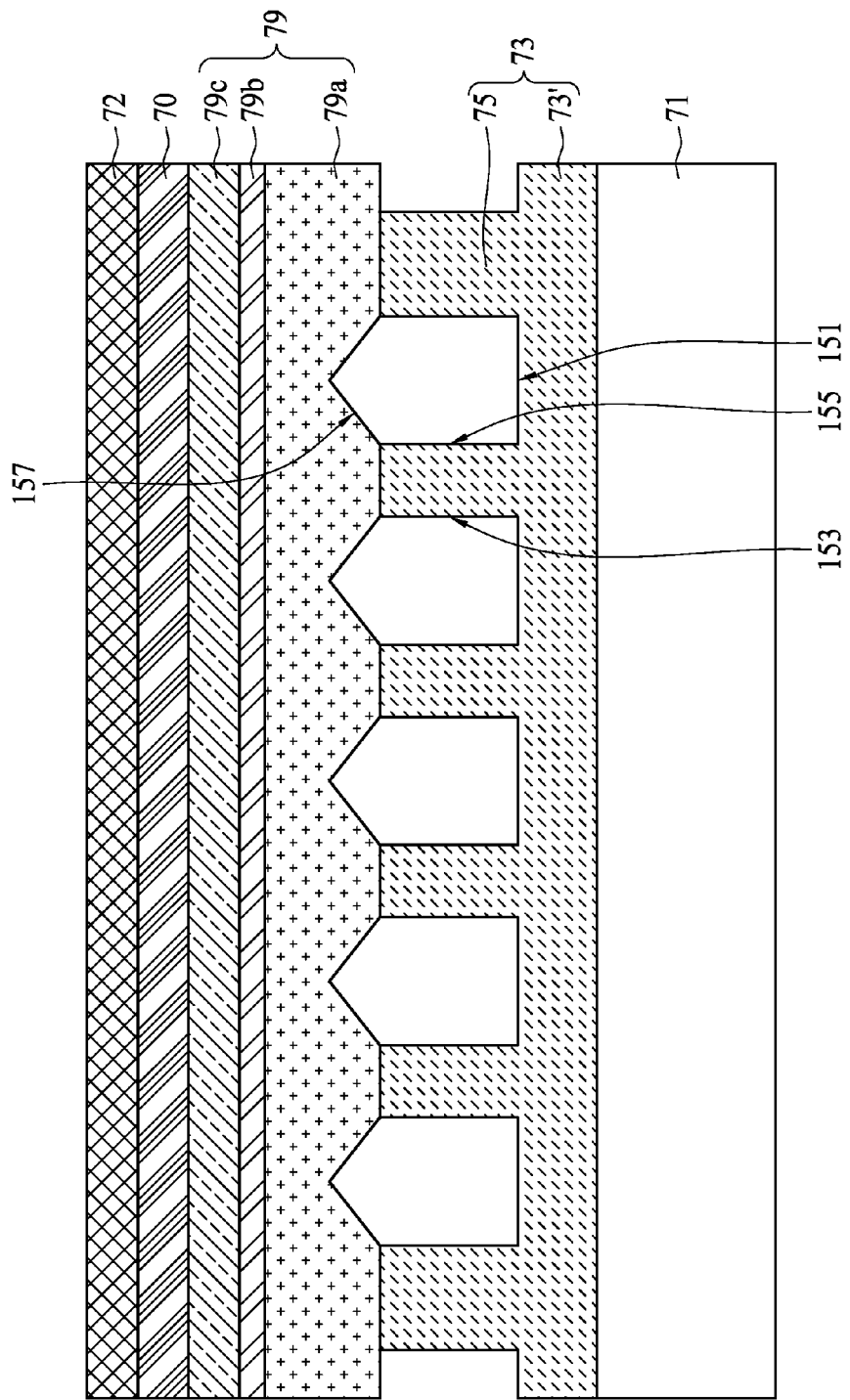

The vertical LED structure is now ready for a CLO process in order to complete the substrate transfer. As shown in FIG. 14, the trimmed SOG 77' is removed by a first etching process such as a buffered oxide etch (BOE), wherein the etching stops at the heterojunction and exposes the side walls of the otherwise laterally covered nanopillars 75. Generally, the etchant used to remove the SOG can be BOE or another hydrofluoride-based solution. The result of this etch provides the nanopillar array with a semi-open structure to facilitate the subsequent etching process. As shown in FIG. 15, the GaN nanopillars 75 and the GaN regrowth layer 79 are partially removed by a second etching process such as using heated potassium hydroxide solution (KOH, 70 degree Celsius). Other etchants that can be used in this step include sulfuric acid solution, phosphoric acid solution, acetic acid solution, and oxalic acid solution. The etchant is heated to an elevated temperature of from 50 to 150 degrees Celsius, preferably between 90 and 120 degrees Celsius.

FIG. 15 shows a semiconductor structure partway through the KOH etching process. Three distinct facets can be identified due to the different etch rates imposed on different crystallographic planes. In one embodiment of the present invention, a c-plane 151 corresponds to GaN $\{0001\}$, an m-plane 153 corresponds to GaN $\{1\bar{1}00\}$, an a-plane 155 corresponds to GaN $\{11\bar{2}0\}$, and an s-plane 157 is a result of a combination of a faster vertical etch rate and a slower lateral etch rate.

Figure 16:
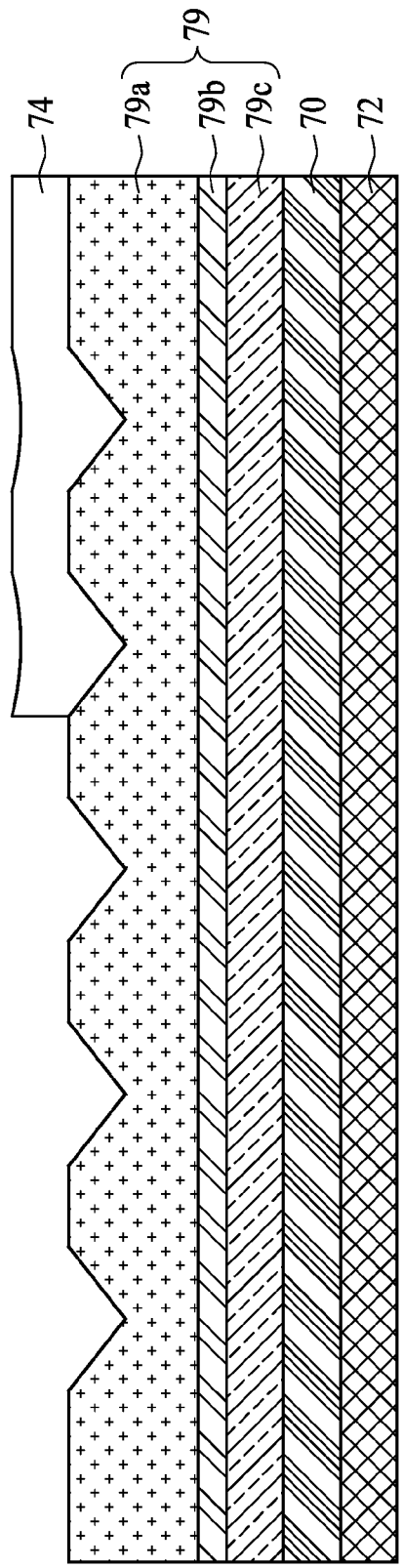
FIG. 16 shows a complete LED structure transferred to a permanent substrate.

In one embodiment of the present invention, a complete LED structure transferred to a permanent substrate 72 is shown in FIG. 16. In FIG. 16, the GaN regrowth layer 79 appears as a semiconductor stacking layer having a first surface in proximity to the substrate 72 and a second surface away from the substrate 72. After the GaN regrowth layer 79 is detached from the nanopillars 75, a first electrode 74 is positioned on top of the second surface of the GaN regrowth layer 79. In another embodiment of the present invention, a second electrode (not shown) contacting the n-type conductive layer 79c and the two electrodes are positioned at the same side of the substrate 72.

Figure 17:
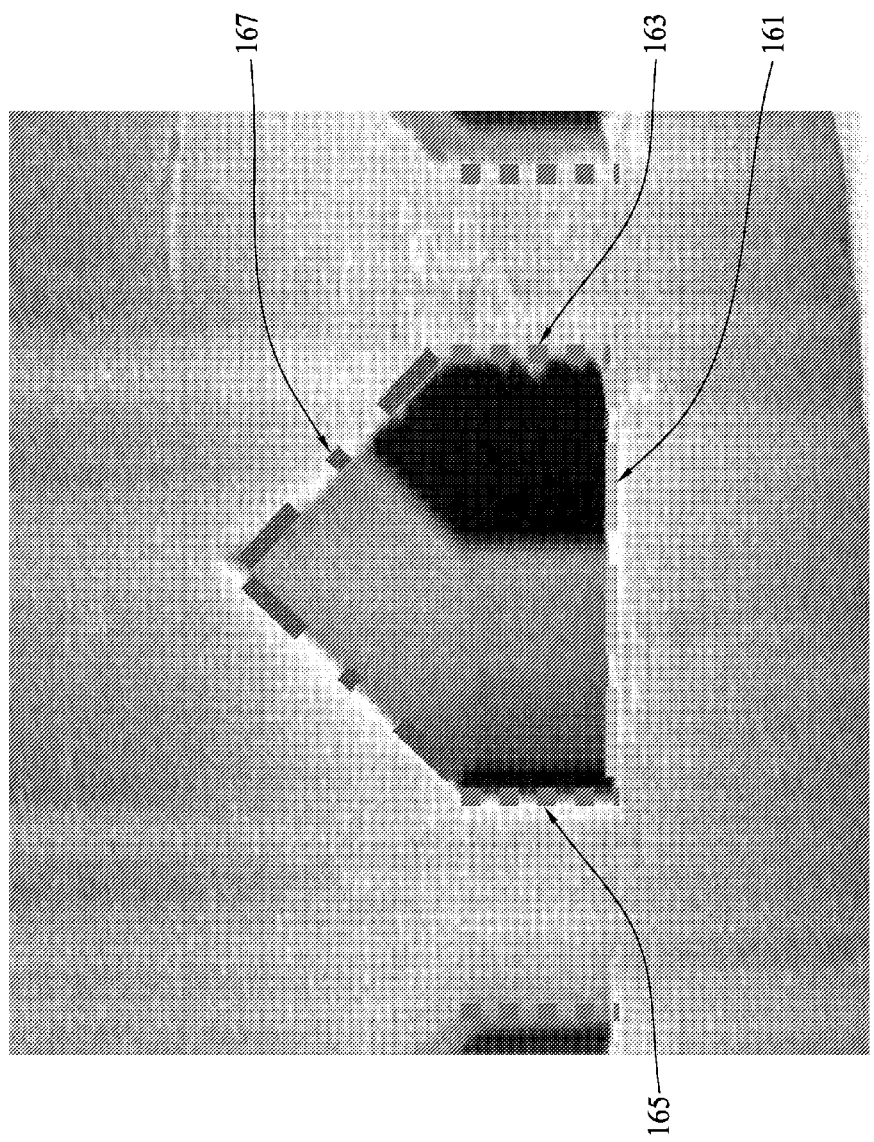
FIG. 17 is a scanning electron micrograph of a side view of the proposed LED structure during a second etching process, whereby the semiconductor structure shows different facets generated by a polarity selective etching according to one embodiment of the present invention.

FIG. 17 is a scanning electron micrograph according to one embodiment of the present invention showing a side view of the faceted semiconductor structure in respect to the illustration of FIG. 15. Faces 161, 163, 165, and 167 correspond to c-plane, a-plane, m-plane, and s-plane respectively. Due to the crystallographic etch or polarity selective etch phenomenon, the spacing between each nanopillar and the diameter of each nanopillar is set in such a way that by the time a nanopillar is consumed by the slower lateral etch, the regrowth GaN layer 79 consumed by a combinatorial etch has already formed inclined facets 157 which act as an effective etch stop, preventing the damage from extending to the light emitting active film. In one embodiment of the present invention, the spacing between each nanopillar is in a range of from 10 nm to 1000 nm, preferably 750 nm; the diameters of the nanopillars range from 50 nm to 1000 nm, preferably 350 nm; and the heights of the nanopillars is under 1000 nm, preferably to be 800 nm.

A bonding selective etch follows the polarity selective etch at the final stage of the substrate separation. Referring back to FIG. 15, the interface between nanopillars 75 and the GaN regrowth layer 79 is weaker in structural integrity due to stress concentration and high dislocation density formed during the ELOG process. Heated KOH prefer to attack the pillar through this area and therefore, a portion of the GaN regrowth layer 79 is fractured from this specific interface. The inclined facets 157 remaining on the separated thin film automatically create a roughened surface of the GaN regrowth layer 79, thereby enhancing the light extracting efficiency.

Figure 18B:
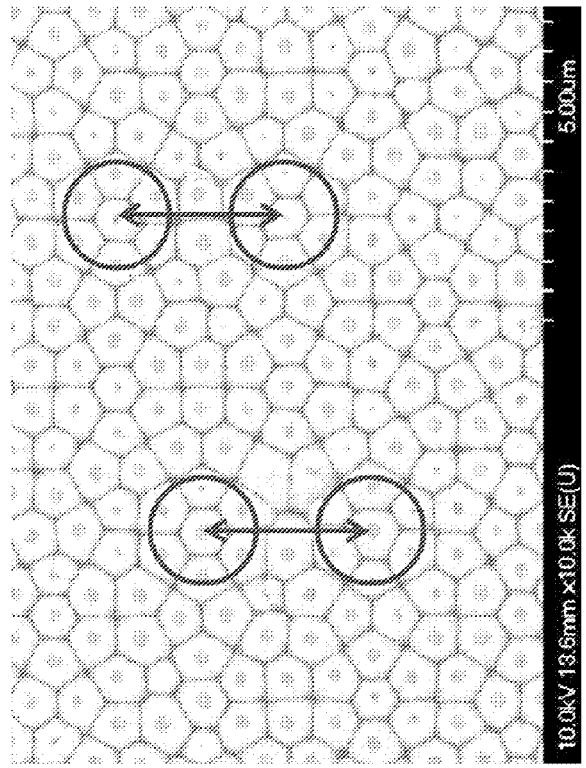
FIG. 18B is a scanning electron micrograph of the second surface morphology of the second semiconductor layer after all the etching processes, wherein the second surface morphology having the arrangement of the underlying nanopillars shown in FIG. 18A.
Figure 18A:
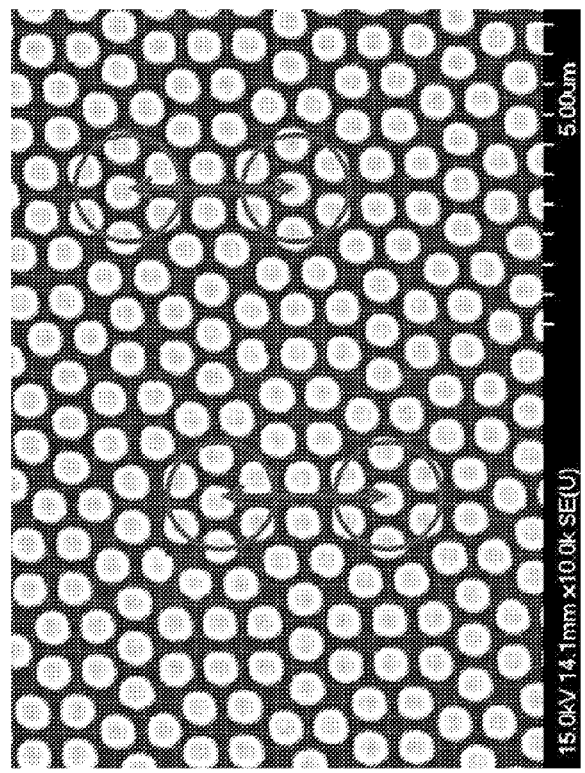
FIG. 18A is a top view of the nanopillars shown in a scanning electron micrograph according to one embodiment of the present invention.

FIG. 18A is a top view of the nanopillars 75 shown in a scanning electron micrograph. FIG. 18B is the second surface morphology of the GaN regrowth layer 79 after all the etching processes, wherein the second surface of the GaN regrowth layer 79 is the detached surface in the last etching process. The GaN regrowth layer 79 is deposited by an epitaxial lateral overgrowth (ELOG) shown in a scanning electron micrograph and having a surface morphology of the plurality of nano-scaled patterns. A hexagonal pattern marked by circles shown in FIG. 18B matches the underlying hexagonal pattern of the nanopillars shown in FIG. 18A. This electron micrograph demonstrates that the GaN regrowth is initiating from the exposed top surfaces of the nanopillars and is followed by the lateral growth. The circles overlaying the electron micrograph are guides to show how the patterns correlate between 18A and 18B. The lateral growth ceases when the coalescence front touches the adjacent single crystal, and a plurality of columnar GaN single crystals constitute the regrowth GaN thin film.

In one embodiment of the present invention, the SOG 77' surrounding the nanopillars 75 provides a flat and open platform for the subsequent epitaxial regrowth; after removing the SOG 77' by a BOE etch, the empty space originally occupied by the SOG forms a continuous network which creates a highly permeable environment for the heated KOH solution to enter and remove the GaN materials. A nanopillar-exposing structure goes through several cycles of 10-second heated KOH solution immersion followed by a rinse in deionized (DI) water. It is crucial to repeat this cycle multiple times if expecting a large area of chip-level separation. In one embodiment of the present invention, a 300 micrometer square substrate separation can be obtained with high uniformity across the sample using the proposed semiconductor structure and method in the present invention.

Figure 19:
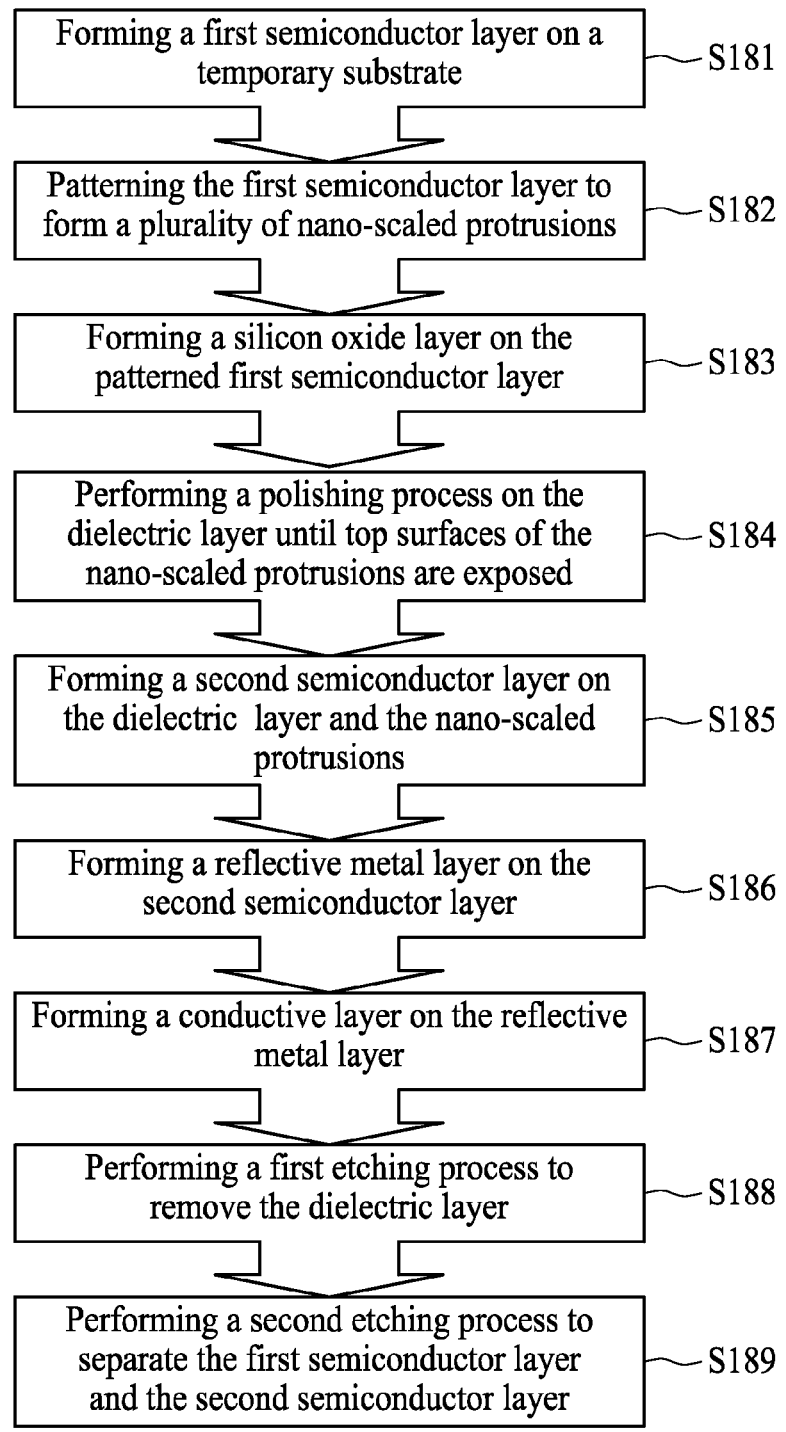
FIG. 19 is a flow chart of the processing steps for the semiconductor structure disclosed in the present invention.

FIG. 19 is a flow chart of the processing steps for the semiconductor structure disclosed in the present invention. In Step 181 (S181), a first semiconductor layer is deposited on a temporary substrate, wherein the first semiconductor layer is a III-nitride compound semiconductor, and the temporary substrate includes sapphire ($Al_2O_3$), silicon, silicon carbide, diamond, lithium aluminate (LAO), lithium gallate (LGO), zinc oxide, gallium arsenide, gallium phosphide, and the composite materials thereof. The epitaxial growth can be carried out by an MOCVD system, a molecular beam epitaxy (MBE) system, or an HVPE system.

In Step 182 (S182), the first semiconductor layer is patterned to form a plurality of nano-scaled protrusions, wherein the nano-scaled protrusions can be formed by a direct epitaxial growth process, or a pattern transfer process such as a nano-imprint lithography (NIL) followed by an inductively coupled plasma reactive ion etch (ICP-RIE). In one embodiment of the present invention, a PECVD $SiO_2$ layer is deposited on the first semiconductor layer, and then a layer of photoresist is spin coated on top of the $SiO_2$ layer. An NIL is performed to soft press the photoresist and transfer the nano-scaled pattern onto the $SiO_2$ layer for the subsequent etch. In the present embodiment, the nano-scaled pattern is a circular array, but other patterns such as polygon, stripes, or crossed stripes can also be used to create the pattern. The patterned $SiO_2$ layer is then used as a hard mask in the subsequent etch of the first semiconductor layer. In one embodiment of the present invention, nano-scaled protrusions are obtained using a SiO$_2$ hard mask with nano-scaled circular patterns. The size of the pattern is in a range of from 50 nm to 1000 nm; the separation space 80 between each pattern is in a range of from 10 nm to 1000 nm, and the height of the patterned nano-scaled object is in a range of from 300 to 1000 nm.

In Step 183 (S183), a silicon oxide layer is formed on the patterned semiconductor layer. The silicon oxide can be deposited using a CVD, a PVD, or an SOG process, and the thickness of the oxide layer should be higher than the nano-scaled protrusions which are now embedded in the oxide layer. In a present embodiment, an SOG process is adopted and an optional baking process in a furnace is carried out to remove the solvents in the SOG. In Step 184 (S184), a polishing process is performed on the silicon oxide until top surfaces of the nano-scaled protrusions are exposed. In one embodiment of the present invention, an ICP-RIE process is used to trim down the thickness of the SOG until the emergence of the nano-scaled protrusions' surfaces. Other polishing processes such as dry/wet etching or chemical mechanical polishing can also be used in the polishing step.

In Step 185 (S185), a second semiconductor layer is deposited on the silicon oxide and the nano-scaled protrusions. The epitaxial growth can be carried out by an MOCVD system, a molecular beam epitaxy (MBE) system, or an HVPE system. Due to the heterogeneous nature of the underlying template, an ELOG phenomenon can occur during the epitaxy process. The second semiconductor layer can have the same or different III-nitride materials compared to the first semiconductor layer; however, a p-type, an n-type, and a light emitting active film are formed only in the second semiconductor layer with doping materials such as silicon and magnesium. A single or multi-quantum well structure constitutes the active film that is free of doping, and the material used in the quantum well can be a ternary or a quaternary compound semiconductor alloy.

In Step 186 (S186), a reflective metal layer is sputtered on the p-type conductive film of the second semiconductor layer. The reflective metal includes silver, aluminum, nickel, gold, platinum, titanium, chromium, palladium, and the alloy combination thereof. In Step 187 (S187), an electrical conductive layer is deposited on the reflective metal layer as a permanent substrate, wherein the depositing method includes a sputtering process, a wafer bonding process, or an electrical plating process. The permanent conductive substrate will eventually become one electrode of the light emitting structure, an electrical and heat conductor such as copper, silicon, nickel, tin, and molybdenum are proper candidates for the permanent conductive layer.

In Step 188 (S188), a first etching process is carried out to remove the oxide layer which surrounds the nano-scaled protrusions. In one embodiment of the present invention, a BOE is used to remove the SOG. Other hydrofluoride-based etchants can also be used instead of BOE. In Step 189 (S189), a second etching process is carried out to separate the first semiconductor layer and the second semiconductor layer by using a heated KOH as a wet etchant in the present embodiment. Other wet etchants such as sulfuric acid solution, phosphoric acid solution, acetic acid, and oxalic acid can also be used to remove III-nitride materials. In one embodiment of the present invention, a polarity selective etch and a bonding selective etch can be identified in the second etching process. The polarity selective etch contributes to the formation of inclined facets and the lateral etch of the nano-scaled protrusions, and the bonding selective etch is responsible for the final fracture between the nano-scaled protrusions and the second semiconductor layer.

In summary, the semiconductor structure proposed in the present invention possesses several advantages: 1) a percolation network promotes an effective CLO process to increase the degree of penetration of the chemical etchant, 2) a pseudo-planar template effectively reduces the complexity of the epitaxial growth and enhances the thin film crystalline quality, 3) incorporation of a low temperature chemical lift off and a low cost spin-on-glass process, and 4) the CLO process can be easily achieved with great uniformity over a chip area of 300 square micrometers or more.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
a temporary substrate;
a semiconductor layer positioned on the temporary substrate;
a plurality of patterned nano-scaled protrusions disposed on the semiconductor layer;
a dielectric layer surrounding the plurality of patterned nano-scaled protrusions and disposed on the semiconductor layer;
an n-type conductive film on the plurality of patterned nano-scaled protrusions;
a light emitting active film on the n-type film;
a p-type conductive film on the light emitting active film; and
a reflective layer disposed between the p-type conductive film and a permanent substrate;
wherein the dielectric layer has a thickness equal to or less than the height of the patterned nano-scaled protrusions, and top surfaces of the patterned nano-scaled protrusions are not covered by the dielectric layer;
wherein the plurality of patterned nano-protrusions having a plurality of noncontinuous top surfaces and a continuous bottom surface on the temporary substrate;
wherein the permanent substrate is composed of material with high thermal and high electrical conductivity.

2. The semiconductor structure according to claim 1, wherein the plurality of patterned nano-scaled protrusions and the semiconductor layer are made of the same material.

3. The semiconductor structure according to claim 1, wherein the plurality of patterned nano-scaled protrusions are arranged in a continuous or semi-continuous manner.

4. The semiconductor structure according to claim 1, wherein the morphology of the plurality of patterned nano-scaled protrusions is selected from a group consisting of nanopillars, polyprisms, stripes, crossed stripes, and the combination thereof.

5. The semiconductor structure according to claim 1, wherein the dielectric layer comprises spin-on-glass, silicon oxide, silicon nitride, and silicon oxynitride.

6. The semiconductor structure according to claim 1, wherein the height of the plurality of patterned nano-scaled protrusions is below 1000 nm.

7. The semiconductor structure according to claim 1, wherein the plurality of patterned nano-scaled protrusions are separated by a space in a range of from 10 nm to 1000 nm.

8. The semiconductor structure according to claim 1, wherein an inclined facet having a crystallographic plane disposed on the n-type conductive film, and the crystallographic plane is an s-plane.

* * * * *